(12) United States Patent
Goto et al.

(10) Patent No.: US 9,040,441 B2
(45) Date of Patent: May 26, 2015

(54) OXIDE SINTERED BODY AND SPUTTERING TARGET

(75) Inventors: Hiroshi Goto, Takasago (JP); Yuki Iwasaki, Takasago (JP)

(73) Assignee: KOBELCO RESEARCH INSTITUTE, INC., Kobe-shi (JP)

( * ) Notice: Subject to any disclaimer, the term of this patent is extended or adjusted under 35 U.S.C. 154(b) by 0 days.

(21) Appl. No.: 14/002,768

(22) PCT Filed: Mar. 1, 2012

(86) PCT No.: PCT/JP2012/055247
§ 371 (c)(1),
(2), (4) Date: Sep. 3, 2013

(87) PCT Pub. No.: WO2012/118150
PCT Pub. Date: Sep. 7, 2012

(65) Prior Publication Data
US 2013/0341183 A1    Dec. 26, 2013

(30) Foreign Application Priority Data

Mar. 2, 2011 (JP) ................................ 2011-045268

(51) Int. Cl.
*C23C 14/08* (2006.01)
*C23C 14/34* (2006.01)
(Continued)

(52) U.S. Cl.
CPC ........... *C23C 14/3414* (2013.01); *C04B 35/453* (2013.01); *C04B 35/457* (2013.01);
(Continued)

(58) Field of Classification Search
CPC ..................... C04B 2235/3217; C04B 35/505; C23C 14/3414; C23C 14/3407

USPC .................... 501/126; 204/298.13; 252/519.5
See application file for complete search history.

(56) References Cited

U.S. PATENT DOCUMENTS

| 8,753,548 B2 * | 6/2014 | Yano et al. ............... 252/519.51 |
| 2007/0215456 A1 | 9/2007 | Abe et al. |

(Continued)

FOREIGN PATENT DOCUMENTS

| JP | 2007 277075 | 10/2007 |
| JP | 2008 063214 | 3/2008 |

(Continued)

OTHER PUBLICATIONS

International Search Report Issued May 29, 2012 in PCT/JP12/55247 filed Mar. 1, 2012.

(Continued)

*Primary Examiner* — Noah Wiese
(74) *Attorney, Agent, or Firm* — Oblon, McClelland, Maier & Neustadt, L.L.P.

(57) ABSTRACT

Provided are an oxide sintered body and a sputtering target that are ideal for the production of an oxide semiconductor film for a display device. The oxide sintered body and sputtering target that are provided have both high conductivity and high relative density, are capable of forming an oxide semiconductor film having a high carrier mobility, and in particular, have excellent direct-current discharge stability in that long-term, stable discharge is possible, even when used by the direct-current sputtering method. The oxide sintered body of the invention is an oxide sintered body obtained by mixing and sintering zinc oxide, tin oxide, and an oxide of at least one metal (M metal) selected from the group consisting of Al, Hf, Ni, Si, Ga, In, and Ta. When the in-plane specific resistance and the specific resistance in the direction of depth are approximated by Gaussian distribution, the distribution coefficient σ of the specific resistance is 0.02 or less.

20 Claims, 2 Drawing Sheets

(51) Int. Cl.
*C04B 35/453* (2006.01)
*C04B 35/457* (2006.01)
*H01L 21/02* (2006.01)

(52) U.S. Cl.
CPC . *C04B2235/3217* (2013.01); *C04B 2235/3244* (2013.01); *C04B 2235/3251* (2013.01); *C04B 2235/3284* (2013.01); *C04B 2235/3286* (2013.01); *C04B 2235/3293* (2013.01); *H01L 21/02554* (2013.01); *H01L 21/02565* (2013.01); *H01L 21/02631* (2013.01); *C23C 14/08* (2013.01); *C23C 14/086* (2013.01)

(56) References Cited

U.S. PATENT DOCUMENTS

| | | | |
|---|---|---|---|
| 2009/0197757 A1 | 8/2009 | Fukushima | |
| 2009/0308635 A1* | 12/2009 | Yano et al. | 174/126.1 |
| 2010/0108502 A1 | 5/2010 | Inoue et al. | |
| 2010/0266787 A1* | 10/2010 | Yano et al. | 428/1.1 |
| 2011/0240934 A1 | 10/2011 | Abe et al. | |
| 2011/0260121 A1* | 10/2011 | Yano et al. | 252/519.51 |
| 2013/0001080 A1 | 1/2013 | Abe et al. | |

FOREIGN PATENT DOCUMENTS

| | | |
|---|---|---|
| JP | 2008 214697 | 9/2008 |
| JP | 2010-18457 A | 1/2010 |
| WO | 2010 058533 | 5/2010 |
| WO | 2010 067571 | 6/2010 |

OTHER PUBLICATIONS

Written Opinion of the International Searching Authority Issued May 29, 2012 in PCT/JP12/55247 filed Mar. 1, 2012.

* cited by examiner

OXIDE SINTERED BODY AND SPUTTERING TARGET

CROSS REFERENCE TO RELATED APPLICATIONS

The present application is a 35 U.S.C. §371 national stage patent application of International patent application PCT/JP2012/055247, filed on Mar. 1, 2012, published as WO/2012/118150 on Sep. 7, 2012, the text of which is incorporated by reference, and claims the benefit of the filing date Japanese application no. 2011-045268, filed on Mar. 2, 2011, the text of which is also incorporated by reference.

TECHNICAL FIELD

The present invention relates to an oxide sintered body and a sputtering target used for depositing an oxide semiconductor thin film for a thin film transistor (TFT) by sputtering, which is used for a display device, such as a liquid crystal display or an organic EL display.

BACKGROUND ART

Amorphous (non-crystalline) oxide semiconductors used in a TFT have a high carrier mobility and a large optical bandgap as compared to generalized amorphous silicon (a-Si), and can be deposited at low temperature. Thus, the amorphous oxide semiconductors are expected to be applied to next-generation display devices required for large size, high resolution, and high-speed driving, as well as resin substrates with a low heat resistance, and the like. In formation of the above oxide semiconductor (film), a sputtering method is preferably used which involves a sputtering target made of the same material as the film. The thin film formed by the sputtering method has excellent in-plane uniformity of the composition or thickness in the direction of the film surface (in the in-plane direction) as compared to thin films formed by ion plating, vacuum evaporation coating, and electron beam evaporation. The sputtering method has an advantage that can form the thin film of the same composition as that of the sputtering target. The sputtering target is normally formed by mixing, sintering, and mechanically processing oxide powders.

The compositions of the oxide semiconductor used in the display device include, for example, In-containing amorphous oxide semiconductors, such as "In—Ga—Zn—O, In—Zn—O, and In—Sn—O (ITO)" (see, for example, Patent Literature 1).

A ZTO-based oxide semiconductor formed by adding Sn to Zn to be made amorphous has been proposed as an oxide semiconductor which can reduce material costs because of the absence of expensive In and which is appropriate for mass production. However, the ZTO-based oxide semiconductor manufactured by a conventional pressureless sintering method tends to have a non-uniform high specific resistance, which often causes abnormal discharge during sputtering. For this reason, for example, Patent literature 2 has proposed a method for suppressing the occurrence of abnormal discharge or cracking during sputtering by controlling a composition of an oxide semiconductor not to contain a tin oxide phase by burning for a long time. Patent literature 3 has proposed a method for suppressing the abnormal discharge during sputtering by performing two-stage processes, namely, a temporary powder burning process at a low temperature of 900 to 1300° C. and a main powder burning process to increase the density of a ZTO-based sintered body.

CITATION LIST

Patent Literature

Patent Literature 1: Japanese Unexamined Patent Publication No. 2008-214697
Patent Literature 2: Japanese Unexamined Patent Publication No. 2007-277075
Patent Literature 3: Japanese Unexamined Patent Publication No. 2008-63214

SUMMARY OF INVENTION

Technical Problem

A sputtering target used for manufacturing an oxide semiconductor film for a display device, and an oxide sintered body as the material of the sputtering target are required to have excellent conductivity and high relative density. Further, the oxide semiconductor film obtained by using the sputtering target is required to have high carrier mobility. In particular, taking into consideration the productivity and manufacturing cost, the sputtering target is required which can be manufactured not by radio-frequency (RF) sputtering, but by DC sputtering adapted for easy deposition at high speed.

However, the technique disclosed in the above Patent Literature 2 is not made by considering the above problem from the standpoint of increasing the density, and is not enough to stably and continuously perform direct-current discharge. Also, the technique disclosed in the above Patent Literature 3 is not made by considering the above problem from the standpoint of improving the conductivity of an oxide sintered body, and is not enough to stably and continuously perform direct-current discharge.

The present invention has been made in view of the above circumstances, and it is an object of the present invention to provide an oxide sintered body and a sputtering target which are suitably used for the production of an oxide semiconductor film for a display device, which have both high conductivity and relative density, and which can deposit an oxide semiconductor film having a high carrier mobility. In particular, the oxide sintered body and the sputtering target are provided which have excellent stability of the direct-current discharge that can stably produce the long-term discharge even when depositing the film by a direct current sputtering method.

Solution to Problem

An oxide sintered body of the invention that can solve the above problems is obtained by mixing zinc oxide, tin oxide, and an oxide of at least one metal (M metal) selected from the group consisting of Al, Hf, Ni, Si, Ga, In, and Ta, and sintering the mixture. When the in-plane specific resistance and the specific resistance in the direction of depth of the oxide sintered body are approximated by Gaussian distribution, a distribution coefficient σ of the specific resistance is 0.02 or less.

In a preferable embodiment of the invention, when the total amount of metal elements contained in the oxide sintered body is set to 1, and [Zn], [Sn], and [M metal] are contents (atomic %) of Zn, Sn, and M metal of all the metal elements, respectively, a ratio of [M metal] to [Zn]+[Sn]+[M metal], a ratio of [Zn] to [Zn]+[Sn], and a ratio of [Sn] to [Zn]+[Sn] respectively satisfy the following formulas:

[M metal]/([Zn]+[Sn]+[M metal])=0.01 to 0.30;

[Zn]/([Zn]+[Sn])=0.50 to 0.80;

and

[Sn]/([Zn]+[Sn])=0.20 to 0.50.

In another preferred embodiment of the invention, the oxide sintered body has a relative density of 90% or more, and a specific resistance of 0.10 Ω·cm or less.

The sputtering target of the invention that can solve the above problems is obtained by using the oxide sintered body described in any one of the above embodiments, in which, when the in-plane specific resistance and the specific resistance in the direction of depth of the sputtering target are approximated by Gaussian distribution, a distribution coefficient σ of the specific resistance is 0.02 or less.

In another preferable embodiment of the invention, when the total amount of metal elements contained in the sputtering target is set to 1, and [Zn], [Sn], and [M metal] are contents (atomic %) of Zn, Sn, and M metal of all the metal elements, respectively, a ratio of [M metal] to [Zn]+[Sn]+[M metal], a ratio of [Zn] to [Zn]+[Sn], and a ratio of [Sn] to [Zn]+[Sn] respectively satisfy the following formulas:

[M metal]/([Zn]+[Sn]+[M metal])=0.01 to 0.30;

[Zn]/([Zn]+[Sn])=0.50 to 0.80;

and

[Sn]/([Zn]+[Sn])=0.20 to 0.50.

In another preferred embodiment of the invention, the sputtering target has a relative density of 90% or more, and a specific resistance of 0.10 Ω·cm or less.

Advantageous Effects of Invention

The present invention can provide the oxide sintered body and sputtering target having a low specific resistance and a high relative density without adding In as a rare metal or even by decreasing the amount of In, which leads to a significant decrease in costs of raw material. Further, the present invention can provide the sputtering target that can continuously exhibit excellent stability of direct-current discharge from the start of use of the sputtering target to the end of use. The use of the sputtering target of the invention can stably and inexpensively deposit the oxide semiconductor film having a high carrier mobility by the direct current sputtering which facilitates the high-speed deposition to thereby improve the productivity of the thin films.

DESCRIPTION OF EMBODIMENTS

The inventors have studied about oxide (ZTO) semiconductors containing Zn and Sn so as to provide an oxide sintered body for a sputtering target which has high conductivity and high relative density, and which can produce the long-term stable discharge even in use of direct current sputtering.

As a result, the M metal containing ZTO sintered body is obtained by mixing respective oxides of metal elements (Zn, Sn) contained in the ZTO, and an oxide of at least one metal (M metal) selected from the group consisting of Al, Hf, Ni, Si, Ga, In, and Ta, and sintering the mixture. The use of the thus-obtained M metal containing ZTO sintered body for a sputtering target can suppress variations in specific resistance of the sputtering target in the same plane (in the in-plane direction and in the length direction) and in the depth direction (in the thickness direction) (that is, which can suppress three-dimensional variations in specific resistance). Thus, the M metal containing ZTO sintered body is found to stably and continuously produce the direct-current discharge over time. Specifically, when the in-plane specific resistance of the oxide sintered body and the specific resistance in the direction of depth thereof are approximated by Gaussian distribution (normal distribution) based on the method to be described later, a distribution coefficient σ of the specific resistance is 0.02 or less. The use of the thus-obtained sintered body can provide an oxide sintered body for a sputtering target and a sputtering target which are of high quality with high relative density and low specific resistance, which have excellent direct-current plasma discharge stability in physical vapor deposition, and which cause little abnormal discharge during the deposition to thereby continuously obtain the stable direct-current discharge. A TFT including an oxide semiconductor thin film deposited using the sputtering target is also found to have very high characteristics, for example, a carrier density of 15 $cm^2$/Vs or more. In order to obtain such a M metal containing ZTO sintered body, preferably, the mixed powder for use should be prepared by appropriately controlling the ratio of the total amount of the M metals to all metal elements (Zn+Sn+M metals), and the ratio of Zn or Sn to the total amount of Zn and Sn. Then, the mixed powder should be sintered under predetermined sintering conditions (preferably, under a non-reducing atmosphere, at a temperature of 1350 to 1650° C. for 5 hours or more). In this way, the invention has been made based on the above findings.

Now, the components of the oxide sintered body in the invention will be described in detail.

The oxide sintered body of the invention is obtained by mixing zinc oxide, tin oxide, and an oxide of at least one metal (metal M) selected from the group consisting of Al, Hf, Ni, Si, Ga, In, and Ta, and sintering the mixture. When the in-plane specific resistance of the oxide sintered body and the specific resistance in the direction of depth thereof are approximated by Gaussian distribution, a distribution coefficient σ of the specific resistance is 0.02 or less.

First, the M metal used in the invention will be described below. The above M metal is at least one kind of metal (M metal) selected from the group consisting of Al, Hf, Ni, Si, Ga, In, and Ta. The M metal is an element contributing to improvement of the relative density of the oxide sintered body and the sputtering target, and reduction in specific resistance thereof. The above M metal is also the element useful for improving the properties of the film deposited by sputtering. The single M metal may be used, or a combination of two or more M metals may be used.

Specifically, the above M metal is selected as an element largely contributing to the improvement of the relative density and the reduction of the specific resistance of the Zn—Sn—O (ZTO) sintered body comprised of only Zn and Sn, based on a number of basic experiments. The ZTO formed of only ZnO and $SnO_2$ as raw material has a high specific resistance and a low relative density as it is sintered. The sputtering target obtained from such a sintered body has the low relative density, and tends to cause abnormal discharge. Upon plasma discharge by a direct current power supply using a sputtering target having a high specific resistance, the plasma discharge is difficult to be produced, which might make the plasma discharge unstable. In contrast, the M metal containing ZTO sintered body of the invention for use has the high relative density and the low specific resistance as will be shown by Examples to be described later, and thus can solve the above-mentioned problem. The use of the M metal containing ZTO sintered body containing M metals defined by the invention, preferably, at a predetermined ratio can improve the relative density of the oxide sintered body and reduce the specific resistance as compared to the use of only ZnO and $SnO_2$ as raw material. This results in improvement of the relative density of the sputtering target obtained by the oxide sintered body, and a decrease in specific resistance to thereby improve the direct-current discharge stability.

In a preferable embodiment of the invention, when the total amount of metal elements contained in the oxide sintered body is set to 1, and [Zn], [Sn], and [M metal] are contents (atomic %) of Zn, Sn, and M metal of all the metal elements (Zn+Sn+M metal), respectively, a ratio of [M metal] to [Zn]+[Sn]+[M metal], a ratio of [Zn] to [Zn]+[Sn], and a ratio of [Sn] to [Zn]+[Sn] respectively satisfy the following formulas. The term "M metal content" means the amount of a M metal in use of the single M metal, or the total amounts of two or more kinds of M metals in use of the two or more kinds of M metals.

[M metal]/([Zn]+[Sn]+[M metal])=0.01 to 0.30;

[Zn]/([Zn]+[Sn])=0.50 to 0.80;

and

[Sn]/([Zn]+[Sn])=0.20 to 0.50.

The ratio of [M metal] to [Zn]+[Sn]+[M metal] (hereinafter simply abbreviated to as an "M metal ratio") is preferably in a range of 0.01 to 0.30. For the M metal ratio of less than 0.01, an effect of the addition of the M metal is not effectively exhibited. In use of the oxide sintered body for the sputtering target, the direct-current discharge stability is degraded, the mobility of a thin film formed is decreased, and the reliability of the TFT is also reduced. In contrast, for the M metal ratio exceeding 0.30, the switching characteristics of the TFT (including increase in off-state current, variations in threshold voltage, decrease in subthreshold characteristics, and the like) are degraded, so that the reliability of the TFT is reduced. Thus, the thin film deposited cannot achieve the performance required for application to the display device and the like. When the above M metal is comprised of metal other than In, for the M metal ratio exceeding 0.30, the density of the sintered body cannot be 90% or more, and the specific resistance thereof becomes higher, which does not stabilize the direct-current plasma discharge, and tends to easily produce the abnormal discharge.

More preferably, the M metal ratio depends on the kind of the M metal. That is, when the above M metal contains at least In or Ga, the M metal ratio is preferably not less than 0.10 and not more than 0.25, and more preferably not less than 0.15 and not more than 0.25. When the above M metal is comprised of at least one metal element selected from the group consisting of Al, Hf, Ni, Si, and Ta (that is, the above M metal does not contain In and Ga), the M metal ratio is preferably not less than 0.01 and not more than 0.10.

The ratio of [Zn] to ([Zn]+[Sn]) (hereinafter simply abbreviated as a "Zn ratio") is preferably in a range of 0.50 to 0.80. For the Zn ratio of less than 0.50, the micro-workability of the thin film formed by the sputtering is degraded, which is likely to cause an etching residue. In contrast, for the Zn ratio exceeding 0.80, the deposited thin film reduces the resistance to chemicals, and thus cannot achieve the high-accuracy processing because of the high dissolution rate of components of the thin film into an acid in the microfabrication. The Zn ratio is more preferably not less than 0.55 and not more than 0.70.

The ratio of [Sn] to ([Zn]+[Sn]) (hereinafter simply abbreviated as a "Sn ratio") is preferably in a range of 0.20 to 0.50. For the Sn ratio of less than 0.20, the thin film deposited by sputtering reduces the resistance to chemicals, and thus cannot achieve the high-accuracy processing because of the high dissolution rate of components of the thin film into an acid in the microfabrication. In contrast, for the [Sn] ratio exceeding 0.50, the micro-workability of the thin film formed by the sputtering is degraded, which is likely to cause an etching residue. Thus, the [Sn] ratio is more preferably not less than 0.25 and not more than 0.40.

When the in-plane specific resistance and the specific resistance in the direction of depth of the oxide sintered body of the invention are approximated by Gaussian distribution (normal distribution), a distribution coefficient σ of the specific resistance is 0.02 or less.

Specifically, 10 or more pieces of the above oxide sintered body are prepared, and the specific resistances in the in-plane direction (in the same plane) and in the depth direction are measured by a four-probe method.

The in-plane specific resistance of the oxide sintered body is measured in the following way. First, a 12 cm square oxide sintered body is prepared, and its surface is ground to be exposed (which corresponds to a sputtering target surface). Stick-like samples having a size of 3 mm×3 mm×30 mmL are cut out of the sintered body in a plurality of positions on the exposed surface (in three positions in total, including the center position, and other positions spaced apart from the center by ±6 cm). Each sample ground and processed is used as a sample for measurement of an in-plane specific resistance. The specific resistance of each of the thus-obtained three kinds of samples for measurement of the in-plane specific resistance is measured by the four probe method.

Next, the specific resistance in the depth direction of the oxide sintered body is measured in the following way. First, an oxide sintered body having a thickness of 9 mmt is prepared, and cut in the horizontal direction in a plurality of positions in the depth direction (three positions in total, including a sample having its center positioned in depth of 1.5 mm, another sample having its center positioned in depth of 4.5 mm (in the position of a half of the thickness of the oxide sintered body), and a further sample having its center positioned in depth of 7.5 mm). Each sample for measurement of a specific resistance in the depth direction is cut in the horizontal direction from a part of the in-plane surface exposed (with the center of each sample set along in the same depth direction). The above sample has a size of 3 mm×3 mm×30 mmL. The specific resistance of the ground and processed surface of each sample is measured. The specific resistance in the depth direction is measured by the four probe method in the same way as the measurement of the in-plane specific resistance as described above.

The same operation is repeatedly performed on 10 or more pieces of the oxide sintered body, and as a result the distribution coefficient σ of the specific resistance is calculated by approximating the specific resistance by Gaussian distribution represented by the following formula f(x). In the formula, μ is an average of all of the in-plane specific resistances and the specific resistances in the depth direction measured as described above.

[Formula 1]

$$f(x) = \frac{1}{\sqrt{2\pi}\,\sigma} \exp\left\{-\frac{(x-\mu)^2}{2\sigma^2}\right\} \quad (1)$$

In the invention, the thus-obtained distribution coefficient σ of the specific resistance needs to be controlled to be 0.02 or less. For the distribution coefficient of the specific resistance exceeding 0.02, variations in specific resistance among samples become large, which cannot stably and continuously produce the direct current discharge. The oxide sintered body having a smaller distribution coefficient has higher quality, and the distribution coefficient is preferably 0.015 or less.

As mentioned above, in the invention, the distribution coefficient of the in-plane specific resistance and the specific resistance in the depth direction of each of 10 or more pieces of the oxide sintered body is calculated. The reason why the "10 or more pieces" are set in the invention is that a distribution coefficient is determined with higher accuracy by using as many specimens as possible. In the invention, "at least 10" typifies the number of pieces for sampling. The invention selects the minimum 10 pieces of the oxide sintered body, and measures the distribution coefficient of each piece according to the above procedure. All the oxide sintered body satisfying the distribution coefficient of 0.02 or less fall within the range of the invention.

The oxide sintered body of the invention preferably satisfies the relative density of 90% or more, and the specific resistance of 0.10 Ω·cm or less. The above specific resistance is a value obtained by measuring the position in the depth of t/2 (t=thickness, t/2 corresponding to the center) of the oxide sintered body (or sputtering target) by the four probe method.

(Relative Density of 90% or More)

The oxide sintered body of the invention has a very high relative density, preferably of 90% or more, and more preferably of 95% or more. The high relative density can prevent the occurrence of cracking or nodules during sputtering, and can advantageously constantly and continuously keep the discharge stable from the start of use of the sputtering target to the end of use.

(Specific Resistance of 0.10 Ω·cm or Less)

The oxide sintered body of the invention has a small specific resistance, preferably, of 0.100 Ω·cm or less, and more preferably, of 0.05 Ω·cm or less. This setting allows the deposition by the DC sputtering method of plasma discharge using a DC power supply. As a result, the physical vapor deposition (sputtering) using a sputtering target can be effectively performed on a production line of the display devices.

Next, a method for manufacturing the oxide sintered body according to the invention will be described below.

Figure 1:
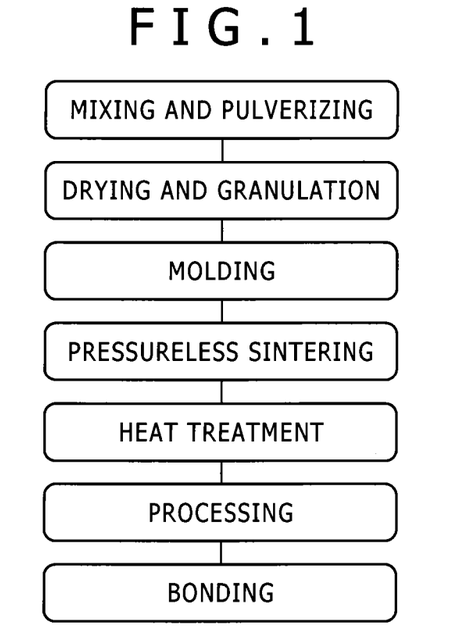
FIG. 1 is a diagram showing basic steps for manufacturing an oxide sintered body and a sputtering target (M metal=Al, Hf, Ni, Si, Ga, and Ta) according to the invention.
Figure 2:
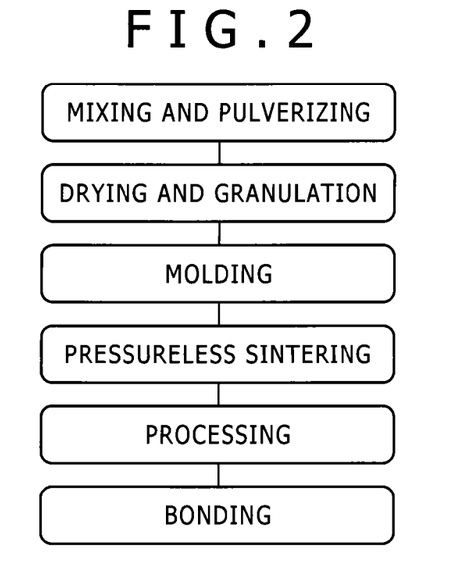
FIG. 2 is a diagram showing basic steps for manufacturing an oxide sintered body and a sputtering target (M metal=In) according to the invention.

The oxide sintered body of the invention is obtained by mixing zinc oxide; tin oxide; and an oxide of at least one metal (M metal) selected from the group consisting of Al, Hf, Ni, Si, Ga, In, and Ta, and sintering the mixture. Basic steps from the powders of raw material up to the sputtering target are shown in FIGS. 1 and 2. FIG. 1 illustrates a flow of manufacturing steps of the oxide sintered body when the M metal is a metal other than In, that is, M metal=Al, Hf, Ni, Si, Ga, and/or Ta. FIG. 2 illustrates a flow of manufacturing steps of the oxide sintered body in the case of M metal=In. By comparison between the steps of FIG. 1 and FIG. 2, the procedure shown in FIG. 1 involves a heat treatment after pressureless sintering, whereas the procedure shown in FIG. 2 does not involve the heat treatment after the pressureless sintering, which is only a difference between FIGS. 1 and 2. The invention covers an embodiment which uses two or more metal elements as the M metal. For example, when two metals, In and Al are used as the M metal, the oxide sintered body has only to be manufactured based on the procedure shown in FIG. 2.

Referring to FIG. 1, in the case of M metal=Al, Hf, Ni, Si, Ga, and/or Ta, the manufacturing steps of the oxide sintered body will be described below. FIG. 1 illustrates the basic steps in which the oxide sintered body obtained by mixing and pulverizing, drying and granulation, molding, pressureless sintering, and heat treatment of respective oxide powders in that order is further processed and bonded to produce a sputtering target. In the invention, only the sintering conditions and the heat treatment conditions thereafter in the above steps are appropriately controlled as will be described in detail later, and other steps are not limited to specific ones and can be performed by normal processes appropriately selected. Now, each step will be described below, but the invention is not limited thereto. In the invention, preferably, the above conditions are appropriately controlled depending on the kind of the M metal and the like.

First, zinc oxide powder, tin oxide powder, and oxide M metal powder are blended at a predetermined ratio, mixed, and pulverized. The purity of each of the raw material powders used is preferably about 99.99% or more. Even the presence of a small amount of impurity element might degrade the semiconductor properties of the oxide semiconductor film. The blending ratio of the raw material powders is preferably controlled such that the ratio of each of Zn, Sn, and M metal is within the above corresponding range.

The mixing and pulverizing processes are preferably performed using a pot mill, into which the raw material powders are charged with water. Balls and beads used in the steps are preferably formed of, for example, nylon, alumina, zirconia, and the like.

Then, the mixed powders obtained in the above steps are dried and granulated, and thereafter molded. In molding, preferably the powders after the drying and granulation are charged into a die having a predetermined size, preformed by die pressing, and then molded by CIP (cold isostatic press) or the like. In order to increase the relative density of the sintered body, the molding pressure in the preforming step is preferably controlled to about 0.2 tonf/cm² or more, and the pressure in the molding is preferably controlled to about 1.2 tonf/cm² or more.

Then, the thus-obtained molded body is sintered under normal pressure. In the invention, the sintering is preferably performed at a sintering temperature of about 1350 to 1650° C. for a holding time of about 5 hours or more. Thus, a large amount of $Zn_2SnO_4$ contributing to the improvement of the relative density is formed in the sintered body, which results in a high relative density of the sputtering target, and thus improves the discharge stability. As the sintering temperature becomes higher, the relative density of the sintered body tends to be improved, and also the molded body can be sintered for a shorter time, which is preferable. However, as the sintering temperature is excessively high, the sintered body is apt to be decomposed. Accordingly, the sintering conditions are preferably within the above ranges. The sintering is more preferably performed at a sintering temperature of about 1450 to 1600° C. for a holding time of about 8 hours or more. The sintering atmosphere is preferably a non-reducing atmosphere, and for example, is preferably controlled by introducing oxygen gas into a furnace.

Then, the thus-obtained sintered body is subjected to heat treatment to thereby produce the oxide sintered body of the invention. In order to produce the sintered body that can perform the plasma discharge by a direct current power supply in the invention, the heat treatment is preferably controlled at a heat treatment temperature of about 1000° C. or more for a holding time of about 8 hours or more. The above treatment decreases the specific resistance, for example, from about 100 Ω·cm (before the heat treatment) to 0.1 Ω·cm (after the heat treatment). More preferably, the heat treatment is performed at a heat treatment temperature of about 1100° C. or more for a holding time of about 10 hours or more. The heat treatment atmosphere is preferably a reducing atmosphere, and for example, is preferably controlled by introducing oxygen gas into a furnace. Specifically, the atmosphere is preferably controlled appropriately depending on the kind of the M metal and the like.

After obtaining the oxide sintered body in the way described above, the steps of processing and bonding can be performed by normal methods to produce a sputtering target of the invention. The thus-obtained sputtering target also has a distribution coefficient of the specific resistance of 0.02 or less, like the above-mentioned oxide sintered body. Further, the Zn ratio, Sn ratio, and M metal ratio of the sputtering target satisfy the preferable ratios described above about the oxide sintered body. The relative density and specific resistance of the above sputtering target are very preferable, like the oxide sintered body. The preferred relative density of the sputtering target is preferably almost 90% or more. The preferred specific resistance of the sputtering target is preferably almost 0.10 Ω·cm or less.

Referring to FIG. 2, in the case of M metal=In (that is, when the M metal contains at least In), manufacturing steps of the oxide sintered body will be described below. As mentioned above, in use of the M metal containing at least In, the above-mentioned heat treatment after the pressureless sintering shown in the above-mentioned FIG. 1 is not performed. The phrase "heat treatment after the sintering is not performed in use of the metal containing In" means that the specific resistance of the sintered body can be decreased without the heat treatment, which eliminates the necessity of the heat treatment (that is, provision of the heat treatment is worthless from the viewpoint of the productivity). The phrase does not mean that the heat treatment after the sintering is positively excluded. Even the heat treatment after the pressureless sintering does not adversely affect the characteristics, including the specific resistance. Thus, the heat treatment after the sintering may be performed without taking into consideration the productivity. The thus-obtained sintered body can fall within the scope of claims of the present invention. Except for the above step, the procedure shown in FIG. 2 is the same as that shown in FIG. 1. The detailed description of other steps except for the above step can be understood by the description about FIG. 1.

The present application claims the benefit of priority to Japanese Patent Application No. 2011-045268 filed on Mar. 2, 2011. The disclosure of Japanese Patent Application No. 2011-045268 filed on Mar. 2, 2011 including the specification, drawings and abstract is incorporated herein by reference in its entirety.

EXAMPLES

Now, the present invention will be more specifically described with reference to examples below. However, the invention is not limited to the following examples, and various changes can be appropriately made to the examples so as to comply with the spirit of the invention, and any one of the examples can fall within the technical scope of the invention.

Example 1

Zinc oxide powder (JIS1) having a purity of 99.99%, tin oxide powder having a purity of 99.99%, and aluminum oxide powder having a purity of 99.99% were blended at the ratio of [Zn] [Sn]:[Al]=73.9:24.6:1.5, and mixed by a nylon ball mill for 20 hours. For reference, Table 1 shows the Zn ratio and the Sn ratio. The Al ratio was 0.015. Then, the mixed powders obtained in the above process were dried and granulated, preformed at a molding pressure of 0.5 tonf/cm$^2$ by the die press, and then mainly molded at a molding pressure of 3 tonf/cm$^2$ by the CIP.

As shown in Table 1, the thus-obtained molded body was sintered while being held at 1500° C. under normal pressure for 7 hours. At this time, the sintering was performed under the oxygen atmosphere with oxygen gas introduced into a sintering furnace. Then, the sintered body was put in a heat treatment furnace, and subjected to heat treatment at 1200° C. for 10 hours. The heat treatment was performed under the reducing atmosphere with nitrogen gas introduced into the heat treatment furnace.

Then, the relative density of the thus-obtained oxide sintered body of Example 1 was measured by Archimedes' method to be 90% or more. Then, a specific resistance of the oxide sintered body was measured by a four-probe method to be 0.1 Ω·cm or less. Thus, good results were obtained.

Further, the above oxide sintered body was processed into a piece having φ4 inch×5 mmt, which was bonded to a backing plate to produce the sputtering target. The thus-obtained sputtering target was mounted to sputtering equipment, and then an oxide semiconductor film was formed over a glass substrate (having a size of 100 mm×100 mm×0.50 mm) by DC (direct current) magnetron sputtering. The sputtering conditions were as follows: DC sputtering power of 150 W, Ar/0.1 vol. % O$_2$ atmosphere, and pressure of 0.8 mTorr. As a result, the occurrence of the abnormal discharge (arcing) was not observed from the start of use of the sputtering target to the end of use, so that the stable discharge was confirmed.

When the distribution coefficient of the in-plane specific resistance and the specific resistance in the direction of depth of the sputtering target was measured by the above-mentioned method, the distribution coefficient satisfied the range of the invention (0.02 or less). Variations in distribution coefficient were very small (see Table 1). Table 1 also shows the specific resistance of the sputtering target (in the position of t/2), which also fell within the range (0.10 Ω·cm or less) of the invention.

A thin film deposited under the above sputtering conditions was used to make a thin film transistor with a channel length 10 μm and a channel width 100 μm. Then, the carrier mobility of the transistor was measured. As a result, the high carrier mobility of 15 cm$^2$/Vs or more was obtained.

Example 2

Zinc oxide powder (JIS1) having a purity of 99.99%, tin oxide powder having a purity of 99.99%, and tantalum oxide powder having a purity of 99.99% were blended at the ratio of [Zn] [Sn]:[Ta]=73.9:24.6:1.5. The mixed powder was sintered at 1550° C. for 5 hours, and subjected to heat treatment at 1150° C. for 14 hours. Except for the above points, the same processes as those in Example 1 described above were performed in Example 2, which produced the oxide sintered body of Example 2 (Ta ratio=0.015).

The relative density and specific resistance of the thus-obtained oxide sintered body of Example 2 were measured in the same way as in the above Example 1. As a result, the relative density of the oxide sintered body was 90% or more, and the specific resistance thereof was 0.1 Ω·cm or less, so that good results were obtained.

Then, the above oxide sintered body was used to perform the DC (direct current) magnetron sputtering in the same way as in the above Example 1. As a result, the occurrence of the abnormal discharge (arcing) was not observed, and the stable discharge was confirmed.

When the distribution coefficient of the in-plane specific resistance and the specific resistance in the direction of depth of the sputtering target was measured by the above-mentioned method, the distribution coefficient satisfied the range of the invention (0.02 or less). Variations in distribution coefficient were very small (see Table 1). Table 1 also shows the specific resistance of the sputtering target (in the position of t/2), which also fell within the range (0.10 Ω·cm or less) of the invention.

The carrier mobility was measured using a thin film deposited under the above sputtering conditions, in the same way as in the above Example 1. As a result, the high carrier mobility of 15 cm$^2$/Vs or more was obtained.

Example 3

Zinc oxide powder (JIS1) having a purity of 99.99%, tin oxide powder having a purity of 99.99%, and indium oxide powder having a purity of 99.99% were blended at the ratio of [Zn]:[Sn]:[In]=45.0:45.0:10.0. The mixed powder was sintered at 1550° C. for 5 hours (without the heat treatment). Except for the above points, the same processes as those in Example 1 described above were performed in Example 3, which produced the oxide sintered body of Example 3 (In ratio=0.10).

The relative density and specific resistance of the thus-obtained oxide sintered body of Example 3 were measured in the same way as in the above Example 1. As a result, the relative density of the oxide sintered body was 90% or more, and the specific resistance thereof was 0.1 Ω·cm or less, so that good results were obtained.

Then, the above oxide sintered body was used to perform the DC (direct current) magnetron sputtering in the same way as in the above Example 1. As a result, the occurrence of the abnormal discharge (arcing) was not observed, and the stable discharge was confirmed.

When the distribution coefficient of the in-plane specific resistance and the specific resistance in the direction of depth of the sputtering target was measured by the above-mentioned method, the distribution coefficient satisfied the range of the invention (0.02 or less). Variations in distribution coefficient were very small (see Table 1). Table 1 also shows the specific resistance of the sputtering target (in the position of t/2), which also fell within the range (0.10 Ω·cm or less) of the invention.

Figure 3:
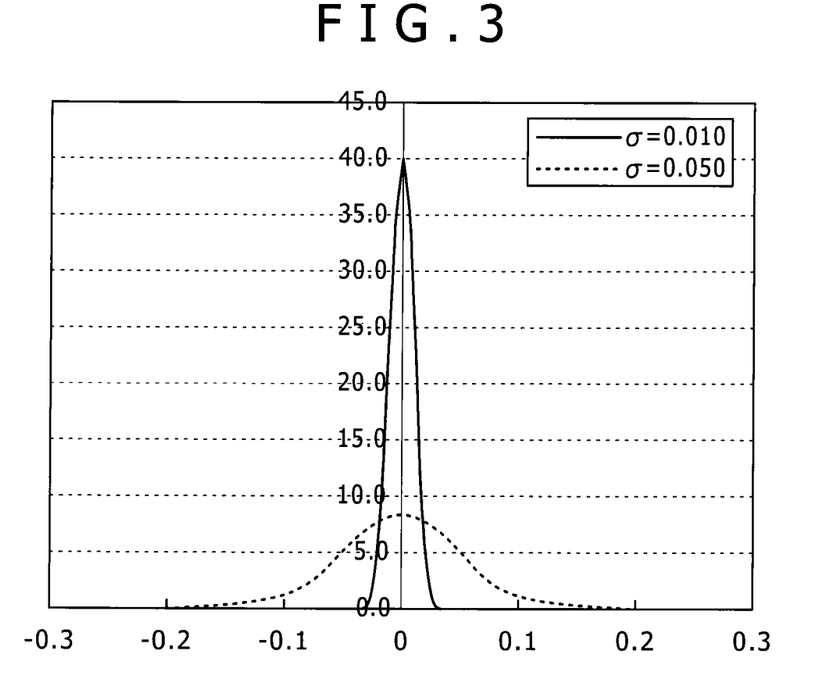
FIG. 3 is a graph showing the result of a Gaussian distribution (normal distribution) curve of a specific resistance of each of a sputtering target of Example 3 (as an example of the invention), and a sputtering target of Comparative Example 1.

For reference, FIG. 3 shows the result of a Gaussian distribution (normal distribution) curve of a specific resistance of the sputtering target of Example 3 (in FIG. 3, σ=0.010). For comparison, FIG. 3 shows the result of a Gaussian distribution (normal distribution) curve of a specific resistance of the sputtering target of Comparative Example 1 to be described later (in FIG. 3, σ=0.050).

The carrier mobility was measured using a thin film deposited under the above sputtering conditions in the same way as in the above Example 1. As a result, the high carrier mobility of 15 cm$^2$/Vs or more was obtained.

Example 4

Zinc oxide powder (JIS1) having a purity of 99.99%, tin oxide powder having a purity of 99.99%, and indium oxide powder having a purity of 99.99% were blended at the ratio of [Zn] [Sn]:[In]=35.0:35.0:30.0. The mixed powder was sintered at 1550° C. for 5 hours (without any heat treatment). Except for the above point, the same processes as those in Example 1 described above were performed in Example 4, which produced the oxide sintered body of Example 4 (In ratio=0.10).

The relative density and specific resistance of the thus-obtained oxide sintered body of Example 4 were measured in the same way as in the above Example 1. As a result, the relative density of the oxide sintered body was 90% or more, and the specific resistance thereof was 0.1 Ω·cm or less, so that good results were obtained.

Then, the above oxide sintered body was used to perform the DC (direct current) magnetron sputtering in the same way as in the above Example 1. As a result, the occurrence of the abnormal discharge (arcing) was not observed, and the stable discharge was confirmed.

When the distribution coefficient of the in-plane specific resistance and the specific resistance in the direction of depth of the sputtering target was measured by the above-mentioned method, the distribution coefficient satisfied the range of the invention (0.02 or less). Variations in distribution coefficient were very small (see Table 1). Table 1 also shows the specific resistance of the sputtering target (in the position of t/2), which also fell within the range (0.10 Ω·cm or less) of the invention.

The carrier mobility was measured using a thin film deposited under the above sputtering conditions in the same way as in the above Example 1. As a result, the high carrier mobility of 15 cm$^2$/Vs or more was obtained.

Example 5

Zinc oxide powder (JIS1) having a purity of 99.99%, tin oxide powder having a purity of 99.99%, and gallium oxide powder having a purity of 99.99% were blended at the ratio of [Zn]:[Sn]:[Ga]=60.0:30.0:10.0. The mixed powder was sintered at 1600° C. for 8 hours, and subjected to the heat treatment at 1200° C. for 16 hours. Except for the above points, the same processes as those in Example 1 described above were performed in Example 5, which produced the oxide sintered body of Example 5 (Ga ratio=0.10).

The relative density and specific resistance of the thus-obtained oxide sintered body of Example 5 were measured in the same way as the above Example 1. As a result, the relative density of the sintered body was 90% or more, and the specific resistance thereof was 0.10 Ω·cm or less, so that good results were obtained.

Then, the oxide sintered body was used to perform DC (direct current) magnetron sputtering in the same way as in the above Example 1. As a result, no abnormal discharge (arching) was caused, and the stable discharge was confirmed.

When the distribution coefficient of the in-plane specific resistance and the specific resistance in the direction of depth of the sputtering target was measured based on the above-mentioned method, the distribution coefficient satisfied the range of the invention (0.02 or less). Variations in distribution coefficient were very small (see Table 1). Table 1 also shows the specific resistance of the sputtering target (in the position of t/2), which also fell within the range (0.10 Ω·cm or less) of the invention.

The carrier mobility was measured using a thin film deposited under the above sputtering conditions in the same way as in the above Example 1. As a result, the high carrier mobility of 15 cm$^2$/Vs or more was obtained.

Comparative Example 1

Comparative Example 1 produced the oxide sintered body in the same way as in the above Example 2 except that a molded body was sintered while being kept at 1300° C. for 5 hours in a furnace and then subjected to the heat treatment at 1200° C. for 10 hours.

The relative density and specific resistance of the thus-obtained oxide sintered body of Comparative Example 1 were measured in the same way as in the above Example 1. Since the sintering temperature was lower than the lower limit (1350° C.) recommended by the invention, the relative density of the oxide sintered body was less than 90%, and the specific resistance thereof exceeded 0.1 Ω·cm.

Then, the above oxide sintered body was used to perform the DC (direct current) magnetron sputtering in the same way as in the above Example 1. As a result, abnormal discharge irregularly occurred.

When the distribution coefficient of the in-plane specific resistance and the specific resistance in the direction of depth of the sputtering target was measured by the above-mentioned method, the distribution coefficient exceeded the range (0.02 or less) of the invention. Large variations in distribution coefficient were observed. Table 1 also shows the specific resistance of the sputtering target (in the position of t/2), which also exceeded the range (0.10 Ω·cm or less) of the invention.

The carrier mobility was measured using a thin film deposited under the above sputtering conditions in the same way as in the above Example 1. As a result, the carrier mobility was measured to be 3.0 cm$^2$/Vs, which was low.

As can be seen from the above results of the experiments, the oxide sintered body of each of Examples 1 to 5 contains the M metal defined by the invention, reduces its Vickers hardness and the distribution coefficient of the Vickers hardness in the depth direction within the preferable ranges, and has the composition ratio of the metals contained in the oxide sintered body satisfying the preferred requirements of the invention. The sputtering target obtained by using the above oxide sintered body has the high relative density and the low specific resistance, and can produce the long-term stable discharge even when manufacturing the thin film by the direct current sputtering. The thin film obtained by using the above sputtering target has the high carrier mobility, and thus is very useful as an oxide semiconductor thin film.

TABLE 1

| | | Zn/(Zn + Sn) | Sn/(Zn + Sn) | Specific resistance (Ω · cm) | Distribution coefficient |
|---|---|---|---|---|---|
| Example 1 | 1.5 at % Al-ZTO (Sintering temperature 1500° C., 7 hr) | 0.750 | 0.250 | $2.3 \times 10^{-2}$ | 0.008 |
| Example 2 | 1.5 at % Ta-ZTO (Sintering temperature 1550° C., 5 hr) | 0.750 | 0.250 | $8.6 \times 10^{-2}$ | 0.019 |
| Example 3 | 10 at % In-ZTO (Sintering temperature 1550° C., 5 hr) | 0.5 | 0.5 | $1.6 \times 10^{-2}$ | 0.010 |
| Example 4 | 30 at % In-ZTO (Sintering temperature 1550° C., 5 hr) | 0.5 | 0.5 | $6.4 \times 10^{-3}$ | 0.007 |
| Example 5 | 10 at % Ga-ZTO (Sintering temperature 1600° C., 8 hr) | 0.667 | 0.3333 | $3.6 \times 10^{-2}$ | 0.011 |
| Comparative example 1 | Ref) 1.5 at % Ta-ZTO (Sintering temperature 1300° C., 5 hr) | 0.750 | 0.250 | $1.1 \times 10^{-1}$ | 0.050 |

The invention claimed is:

1. An oxide sintered body obtained by mixing zinc oxide, tin oxide, and an oxide of at least one metal M selected from the group consisting of Al, Hf, Ni, Si, Ga, and Ta, and sintering the mixture, wherein, when an in-plane specific resistance and a specific resistance in a depth direction of the oxide sintered body are approximated by a Gaussian distribution, a distribution coefficient σ of the specific resistance is 0.02 or less.

2. The oxide sintered body of claim 1, wherein, when a total amount of metal elements in the oxide sintered body is set to 1, and [Zn], [Sn], and [M metal] are contents, in atomic %, of Zn, Sn, and M metal, respectively, a ratio of [M metal] to

[Zn]+[Sn]+[M metal], a ratio of [Zn] to [Zn]+[Sn], and a ratio of [Sn] to [Zn]+[Sn] respectively satisfy:

[M metal]/([Zn]+[Sn]+[M metal])=0.01 to 0.30;

[Zn]/([Zn]+[Sn]) =0.50 to 0.80;

and

[Sn]/([Zn]+[Sn]) =0.20 to 0.50.

3. The oxide sintered body of claim 1, having a relative density of 90% or more, and a specific resistance of 0.10 Ω·cm or less.

4. A sputtering target comprising the oxide sintered body of claim 1, wherein, when an in-plane specific resistance and a specific resistance in a depth direction of the sputtering target are approximated by a Gaussian distribution, a distribution coefficient σ of the specific resistance is 0.02 or less.

5. The sputtering target of claim 4, wherein, when a total amount of metal elements in the sputtering target is set to 1, and [Zn], [Sn], and [M metal] are contents, in atomic %, of Zn, Sn, and M metal, respectively, a ratio of [M metal] to [Zn]+[Sn]+[M metal], a ratio of [Zn] to [Zn]+[Sn], and a ratio of [Sn] to [Zn]+[Sn] respectively satisfy:

[M metal]/([Zn]+[Sn]+[M metal])=0.01 to 0.30;

[Zn]/([Zn]+[Sn]) =0.50 to 0.80;

and

[Sn]/([Zn]+[Sn])=0.20 to 0.50.

6. The sputtering target of claim 4, having a relative density of 90% or more, and a specific resistance of 0.10Ω·cm or less.

7. The oxide sintered body of claim 2, having a relative density of 90% or more, and a specific resistance of 0.10Ω·cm or less.

8. A sputtering target comprising the oxide sintered body of claim 2, wherein, when an in-plane specific resistance and a specific resistance in a depth direction of the sputtering target are approximated by a Gaussian distribution, a distribution coefficient σ of the specific resistance is 0.02 or less.

9. A sputtering target comprising the oxide sintered body of claim 3, wherein, when an in-plane specific resistance and a specific resistance in a depth direction of the sputtering target are approximated by a Gaussian distribution, a distribution coefficient σ of the specific resistance is 0.02 or less.

10. A sputtering target comprising the oxide sintered body of claim 7, wherein, when an in-plane specific resistance and a specific resistance in a depth direction of the sputtering target are approximated by a Gaussian distribution, a distribution coefficient σ of the specific resistance is 0.02 or less.

11. The sputtering target of claim 5, having a relative density of 90% or more, and a specific resistance of 0.10 Ω·cm or less.

12. The sputtering target of claim 8, having a relative density of 90% or more, and a specific resistance of 0.10 Ω·cm or less.

13. The sputtering target of claim 9, having a relative density of 90% or more, and a specific resistance of 0.10 Ω·cm or less.

14. The sputtering target of claim 10, having a relative density of 90% or more, and a specific resistance of 0.10 Ω·cm or less.

15. The oxide sintered body of claim 2, wherein the M metal is Ga, and
the ratio of [M metal] to [Zn]+[Sn]+[M Metal] is not less than 0.10 and not more than 0.25.

16. The oxide sintered body of claim 2, wherein
the M metal is Ga, and
the ratio of [M metal] to [Zn]+[Sn]+[M Metal] is not less than 0.15 and not more than 0.25.

17. The oxide sintered body of claim 2, wherein
the M metal is at least one selected from the group consisting of Al, Hf, Ni, Si, and Ta, and
the ratio of [M metal] to [Zn]+[Sn]+[M Metal] is not less than 0.01 and not more than 0.10.

18. The sputtering target of claim 5, wherein
the M metal is Ga, and
the ratio of [M metal] to [Zn]+[Sn]+[M Metal] is not less than 0.10 and not more than 0.25.

19. The sputtering target of claim 5, wherein
the M metal is Ga, and
the ratio of [M metal] to [Zn]+[Sn]+[M Metal] is not less than 0.15 and not more than 0.25.

20. The sputtering target of claim 5, wherein
the M metal is at least one selected from the group consisting of Al, Hf, Ni, Si, and Ta, and
the ratio of [M metal] to [Zn]+[Sn]+[M Metal] is not less than 0.01 and not more than 0.10.

* * * * *